(12) United States Patent
Poddar et al.

(10) Patent No.: US 8,450,151 B1
(45) Date of Patent: May 28, 2013

(54) MICRO SURFACE MOUNT DEVICE PACKAGING

(75) Inventors: Anindya Poddar, Sunnyvale, CA (US); Tao Feng, Santa Clara, CA (US); Will K. Wong, Belmont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/303,053

(22) Filed: Nov. 22, 2011

(51) Int. Cl.
*H01L 23/08* (2006.01)
*H01L 23/488* (2006.01)
*H01L 23/28* (2006.01)

(52) U.S. Cl.
USPC ........... 438/112; 438/114; 438/126; 438/613; 257/738; 257/702; 257/724

(58) Field of Classification Search
USPC .................. 438/108, 114, 112; 257/737, 738
See application file for complete search history.

(56) References Cited

U.S. PATENT DOCUMENTS

| | | | |
|---|---|---|---|
| 5,384,691 | A | 1/1995 | Neugebauer et al. |
| 6,054,772 | A | 4/2000 | Mostafazadeh et al. |
| 7,749,809 | B2 | 7/2010 | How et al. |
| 7,863,757 | B2 | 1/2011 | How et al. |
| 8,018,050 | B2 | 9/2011 | How et al. |
| 8,030,138 | B1 | 10/2011 | How et al. |
| 2002/0004288 | A1 * | 1/2002 | Nishiyama .................... 438/464 |
| 2003/0146506 | A1 * | 8/2003 | Khan et al. .................... 257/737 |
| 2004/0259288 | A1 | 12/2004 | Mostafazadeh et al. |
| 2005/0181540 | A1 | 8/2005 | Farnworth et al. |
| 2006/0273451 | A1 * | 12/2006 | Kawabata et al. ............. 257/706 |
| 2009/0212428 | A1 * | 8/2009 | Yang et al. .................... 257/738 |
| 2011/0272817 | A1 | 11/2011 | Tojo et al. |

OTHER PUBLICATIONS

U.S. Appl. No. 13/303,073, filed Nov. 22, 2011.
U.S. Appl. No. 13/168,701, filed Jun. 24, 2011.

* cited by examiner

*Primary Examiner* — Olik Chaudhuri
*Assistant Examiner* — Wilner Jean Baptiste
(74) *Attorney, Agent, or Firm* — Eugene C. Conser; Wade J. Brady, III; Frederick J. Telecky, Jr.

(57) ABSTRACT

A variety of improved approaches for packaging integrated circuits are described. In one described approach, a multiplicity of dice are mounted on a carrier (e.g., a plastic carrier). Each die has a plurality of wire bonded contact studs secured to its associated I/O pads. An encapsulant is applied over the carrier to cover the dice and at least portions of the contact studs to form an encapsulant carrier structure. After the encapsulant has been applied, a first surface of the encapsulant and the contact studs are ground such that exposed portions of the contact studs are smooth and substantially co-planar with the encapsulant. In some embodiments, a redistribution layer is formed over the encapsulant carrier structure and solder bumps are attached to the redistribution layer. A contact encapsulant layer is applied over the encapsulant carrier structure to provide extra mechanical support for the resulting packages.

12 Claims, 9 Drawing Sheets

MICRO SURFACE MOUNT DEVICE PACKAGING

BACKGROUND OF THE INVENTION

The present invention relates generally to semiconductor packaging. More specifically, the invention relates to very low cost micro surface mount device (µSMD) packages and processes for forming such packages.

There are a number of different integrated circuit packaging styles that are commercially available today. One such package style is referred to as a micro surface mount device (µSMD). In general, µSMD packages have a footprint that is on the same scale as the footprint of the dice that they protect. In many applications it is desirable to provide some structures about the die to protect the die from exposure to the environment and/or to protect the die from exposure to ambient light. Therefore, unlike simple flip chip mounted dice, µSMD packages have some level of protection provided around the dice.

There are currently a number of approaches that are used to create µSMD packages. In some applications, the contacts on the µSMD packages are aligned with bond pads on the dice encased therein. In other applications, the contacts are redistributed relative to the contacts on the underlying dice. One conventional approach to µSMD packaging is to place a plurality of dice into corresponding cavities formed in a silicon carrier. A spin-on polymer coating is then applied over the top surface of the wafer. Holes are formed in the polymer coating and deposition processes are used to form a redistribution layer over the polymer coating. Solder bumps are formed over the redistribution layer to facilitate electrical connection to external devices. Although such a packaging approach works well in many cases, both the carriers used in such processes and the redistribution layer formation steps tend to be relatively expensive and thus the overall packaging costs are relatively high. Accordingly, there are ongoing efforts to develop more cost effective micro surface mount device packaging techniques.

SUMMARY

A variety of improved approaches for packaging integrated circuits are described. In one described approach, a multiplicity of dice are mounted on a carrier. The carrier is preferably formed from plastic, although plastic carriers are not always required. Each die has a plurality of wire bonded contact studs secured to its associated I/O pads. An encapsulant is applied over the carrier to cover the dice and at least portions of the contact studs to form an encapsulant carrier structure. In some preferred embodiments, screen printing is used to apply the encapsulant. After the encapsulant has been applied, a first surface of the encapsulant and the contact studs are ground such that exposed portions of the contact studs are smooth and substantially co-planar with the encapsulant. These steps define a very low cost approach to forming an interconnect layer for the dice.

In some embodiments, a redistribution layer structure is formed over the encapsulant carrier structure. In such embodiments, some of the contact studs are in electrical communication with the conductive redistribution structure such that the contact studs forms an interconnect layer between the die and the redistribution layer. After the redistribution layer as been formed, solder bumps may be attached to the redistribution layer to serve as electrical I/O contacts for the resulting packages.

In some embodiments, a second encapsulant layer (sometimes referred to as a contact encapsulant layer) is applied over the encapsulant carrier structure. The second encapsulant layer is arranged to embed at least portions of the solder bumps and to cover the redistribution structure (when present).

In some embodiments, singulation grooves are cut into an exposed top surface of the contact encapsulant layer. The singulation grooves extend into the carrier. Thereafter, the back surface of the carrier is ground to thin, but not completely sacrifice the carrier. The grinding preferably removes enough of the carrier to reach the singulation grooves. Thus, the back grinding of the carrier both thins and singulates the resulting packages. With this arrangement, very thin µSMD packages may be formed which fully encase their associated dice.

Improved µSMD packages are also described.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to very low cost packaging using wafer level assembly techniques to form fully encapsulated micro surface mount devices (µSMD) packages. The present invention generally contemplates a "wafer" level packaging approach in which a number of dice are mounted on a suitable carrier and most of the remaining packaging steps are performed in parallel on the populated carrier using the carrier as a support structure. Because a carrier is used, various structures within the packages, such as the dice and corresponding encapsulant layer(s), may be thinned significantly when desired, thereby helping reduce the overall thickness of the resulting packages. In some preferred embodiments, a very low cost carrier (e.g. a plastic/epoxy carrier) is used and much of the carrier structure is eventually sacrificed (e.g. by backgrinding) to facilitate the creation of very thin µSMD packages.

Referring initially to FIGS. 1(a)-1(j), one representative packaging method will be described. In this embodiment, the dice are bumped using wire bonding studs before they are mounted on a carrier. The dice populated carriers are covered (encapsulated) using a low cost encapsulation technique such as screen printing. The wire bonding studs are then exposed and planarized by grinding the top surface of the encapsulant. The resulting encapsulant carrier structure has a flat top surface with exposed electrical contacts which can be redistributed as desired using any of a variety of redistribution techniques. The encapsulant carrier structure is then bumped and additional encapsulant material may optionally be deposited about portions of the contact bumps to provide additional structural reinforcement. The carrier (wafer, strip, etc.) may then be thinned by grinding or other suitable techniques as appropriate to form low profile packages. The encapsulated carrier structure may be half diced prior to the backgrinding operation such that the backgrinding also serves to singulate the resulting µSMD packages. In some implementations, cavities and/or other structures are formed in the carrier via laser ablation to receive the dice. As will be apparent from the following description, a number of techniques are used in combination to provide packages that can be assembled very economically, without necessarily requiring high capital cost packaging equipment.

Figure 1A:
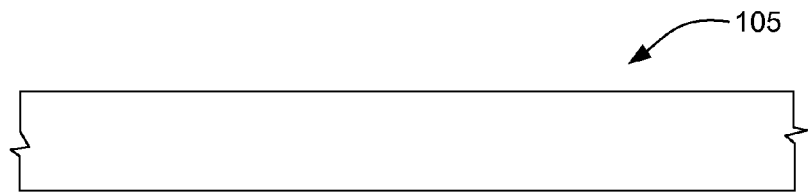
FIGS. 1(a)-1(j) illustrate steps in a process for packaging integrated circuits in accordance with an embodiment of the present invention.

Initially a suitable carrier 105 is formed as shown in FIG. 1(a). In general, the carrier 105 may be formed from a wide variety of materials using any suitable carrier formation technique. In the illustrated embodiment, the carrier 105 is formed from plastic although that is not a strict requirement and in alternative embodiments other suitable carrier structures including silicon wafers, aluminum carriers, etc. may be used. An advantage of using plastic carriers is that they can be formed very inexpensively and work well as the carrier structure. When plastic carriers 105 are used, they can be formed in any suitable manner and they may be formed from any suitable plastic material including various epoxies. It is noted that an advantage of using epoxy type materials is that the carriers may be formed using very low capital cost molding techniques such as transfer molding so that the total amortized cost of producing the carrier 105 is very low. Of course, in other embodiments, any of a variety of other available processes including injection molding, stamping, etc. may be used to form the carrier wafers.

Figure 1B:
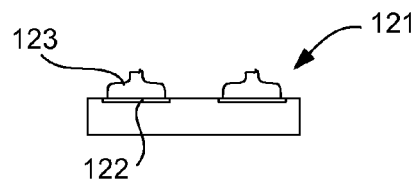

The dice 121 that are mounted on the carrier preferably have a number of I/O pads 122 (commonly called bond pads) that facilitate electrical connection to external devices. Raised conductive "bumps" 123 are preferably formed on the I/O pads. As will be appreciated by those familiar with the art, there are a number of conventional bumping technologies and accordingly, the bumps may formed in any suitable manner. By way of example, solder bumps, wire bonding stud bumps, copper pillars, electroless nickel bumps and/or any other suitable bumping technique may be used. Although a variety of suitable dice bumping techniques may be used, it is noted that wire bonded stud bumps as illustrated in FIG. 1(b) are particularly cost effective since they can be formed using only a conventional wire bonding machine which is a relatively low capital costs piece of equipment that is readily available in most packaging facilities. Typically, the stud bumps 123 are formed from gold or copper bonding wire. However, it should be appreciated that bonding wires formed from other suitable materials may alternatively be used to form the stud bumps. In the illustrated embodiment, the dice are bumped before they are mounted on the carrier. Although this approach is preferred, it is not a strict requirement.

Figure 1C:
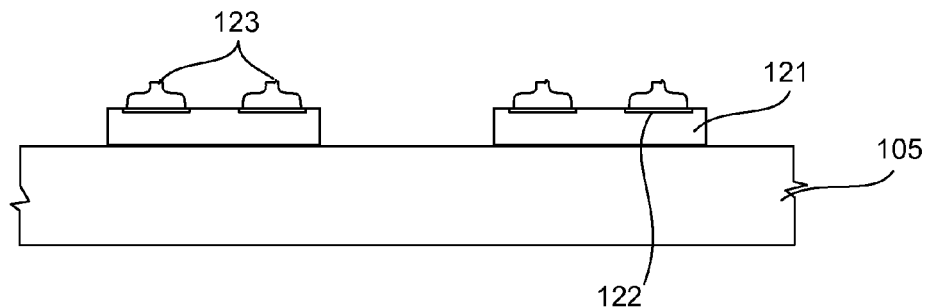

After the carrier 105 and the dice 121 have been selected, the dice 121 are mounted on the carrier 105 using conventional die attach techniques resulting in the structure seen in FIG. 1(c). For illustrative purposes, in the diagrammatic representation of FIG. 1(c), only a couple of dice 121 are shown as being mounted on the carrier 105. However, it should be appreciated that in actual embodiments, a large number of dice 121 are typically mounted on the carrier 105. The actual number of dice mounted on any carrier/wafer will vary with the needs of the particular application. However, by way of example, in many embodiments tens, hundreds, or thousands of dice may be mounted on each carrier 105. The carriers 105, in turn, may have any geometric form factor that is suitable for use with subsequently used packaging equipment. By way of example, the carriers may have a substantially circular geometry or the geometry of a conventional silicon wafer. Alternatively, the carrier 105 may have a substantially rectangular form of a panel or strip, or may assume any other suitable geometry.

Figure 1D:
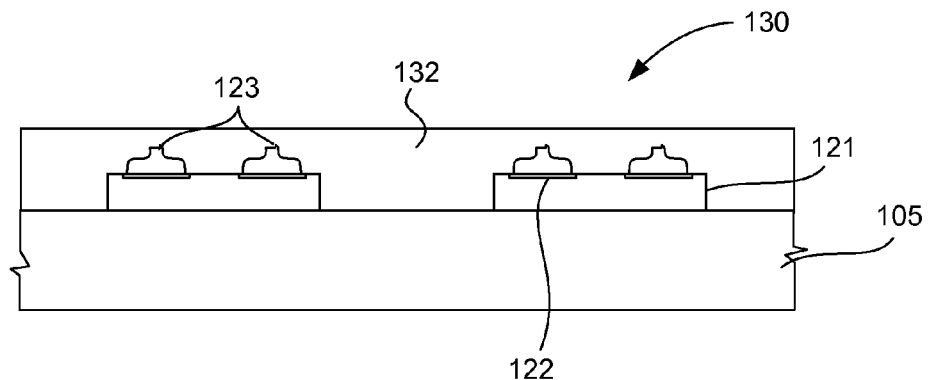

After the dice 121 have been attached to the carrier 105, the dice and their studs 123 are "encapsulated" as a batch over the carrier as illustrated in FIG. 1(d). The dice maybe encapsulated with a plastic encapsulant material 132 using any suitable encapsulation technique including screen printing, stencil printing, molding, spin-on coating, etc. Although any suitable encapsulation technique may be used, it is noted that screen and stencil printing techniques are particularly cost effective and require little capital equipment. The result of the encapsulation is an encapsulant carrier structure 130. A variety of different materials may be used as encapsulant material 132. However, it is generally desirable to match the properties of the encapsulant (e.g. coefficient of thermal expansion (CTE) and Young's modulus (E)) appropriately with the carrier and dice such that the encapsulated carrier structure does not warp (or warp excessively) after encapsulation. In general, encapsulants 132 having similar CTE and E properties to the carrier 105 tend to work well, although this is not a requirement. Indeed, in some embodiments the same type of epoxy may be used as both the carrier 105 and 132, although often it is desirable to have different fillers and/or other characteristics. By way of example, 2950-L2 available from Hitachi Chemical Co., Ltd. is one epoxy material that is suitable for use as the encapsulation material.

Figure 1E:
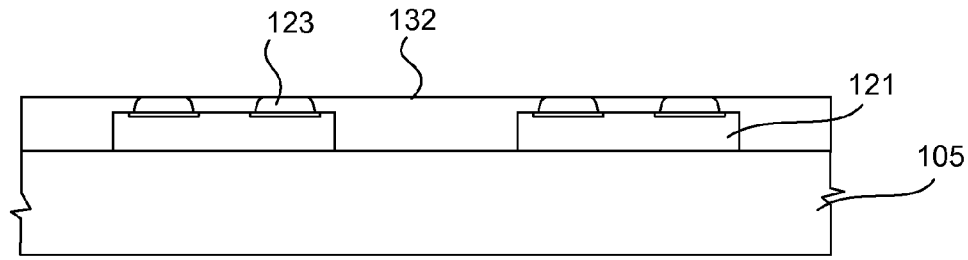

After the dice 121 have been encapsulated, the top surface of the resulting encapsulant carrier structure 130 may be ground (or otherwise thinned) to expose and smooth the exposed surface of the stud bumps 123 as illustrated in FIG. 1(e). The grinding also planarizes the top surface of the encapsulant carrier structure 130. As a result the stud bumps 123 form interconnects passing through the encapsulant 132 and the exposed surface 133 of the planarized interconnects 123 form good contacts that may be used in subsequent processing steps.

Figure 1F:
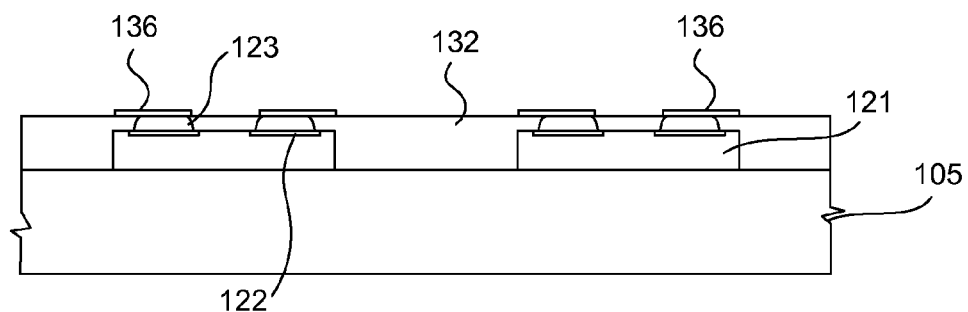
Figure 1G:
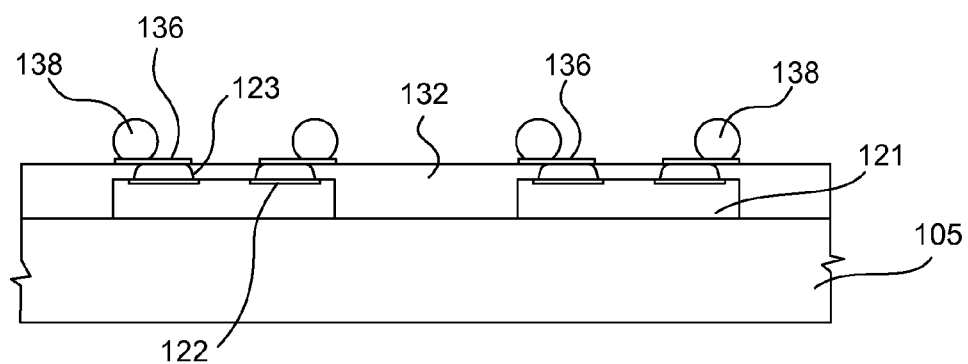

In embodiments where it is desirable to redistribute the die I/O pads, a redistribution/routing arrangement 136 may be formed over the planarized top surface 133 of encapsulant layer 132 as illustrated in FIG. 1(f). The redistribution/routing layer 136 may be formed and patterned using any suitable redistribution layer formation technique including copper deposition and etching, etc. The redistribution/routing arrangement 136 may take the form of a single layer as illustrated in FIG. 1(f) or may include multiple sub-layers (not shown). After redistribution layer 136 has been formed, solder bumps 138 (or any other suitable device interconnect) may be formed on appropriate I/O pads defined in the redistribution layer as shown in FIG. 1(g). In the illustrated embodiment, a fan out type of redistribution is shown (e.g., the solder bumps and their associated I/O pads are located laterally outward in the resulting packages relative to their associated die contact pads). However, in other embodiments, fan in or other redistribution patterns may be used.

Although any redistribution layer formation technique may be used, it is believed that conductor printing techniques may be particularly cost effective in this type of application. In embodiments that do not require redistribution, the planar exposed surfaces 133 of interconnects 123 may be bumped or otherwise used directly as the I/O pads for the resultant packages.

Figure 1H:
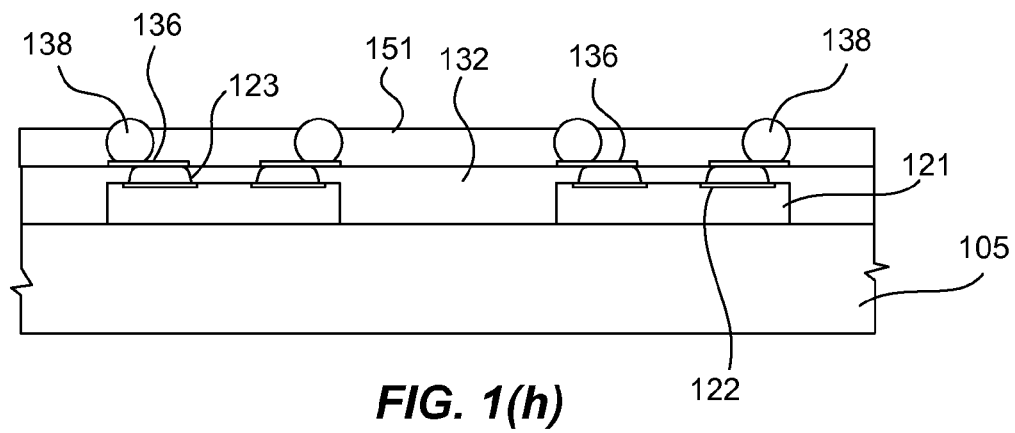

In the illustrated embodiment, an additional encapsulant layer 151 is formed over the redistribution layer 136 to create a carrier structure 153 as illustrated in FIG. 1(h). The contact encapsulant layer 151 at least partially embeds the solder bumps that form the external I/O contacts for the package and serves to provide additional structural support for the resulting packages.

The contact encapsulant layer 151 may be applied over the contact bumps 141 using any suitable technique, such as screen printing, spin on coating, wafer molding, etc. After the contact encapsulant layer 151 has been applied, the solder bumps 138 on carrier structure 153 may be deflashed as appropriate using a laser or by any other suitable technique as necessary.

The appropriate thickness of the contact encapsulant layer will depend in part on the design requirements for the height of the solder bumps that form the external I/O contacts. However, in many applications the desired height of the solder bumps may be relatively large to facilitate good temperature cycling performance, which permits the formation of a relatively thick contact encapsulant layer. This characteristic is used advantageously to provide structural support for the resulting packages. Since the contact encapsulant layer contributes structural support to the resulting packages, the carrier may be thinned substantially which can contribute significantly to the reduction of the overall thickness of the resulting packages. Some other advantages of using a contact encapsulant layer to facilitate the formation of ultra-thin packages are described in U.S. patent application Ser. No. 13/168,701 filed Jun. 24, 2011 which is incorporated herein by reference. The '701 application also describes a variety of approaches for forming the contact encapsulation layer.

Figure 1I:
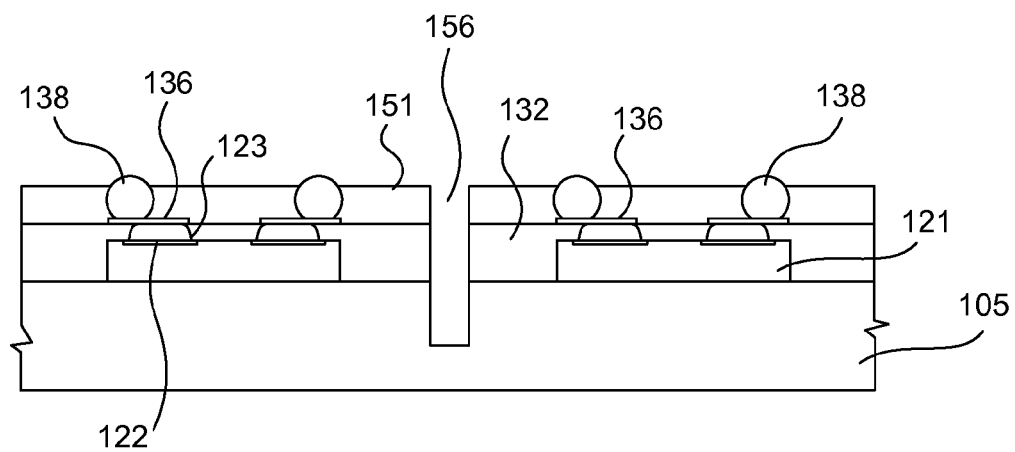
Figure 1J:
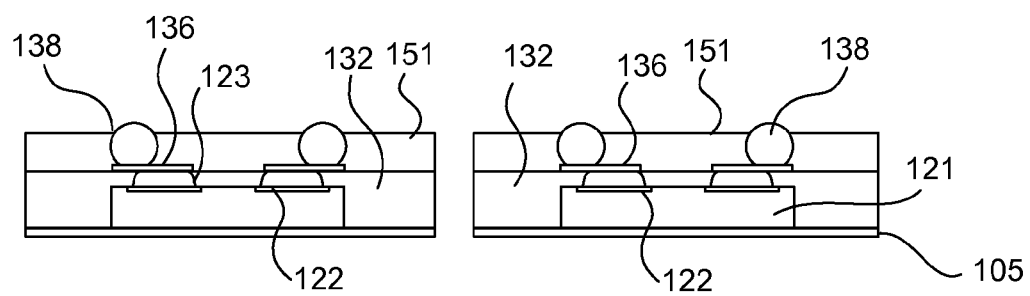

After the contact encapsulant layer 151 has been applied, the molded carrier structure may be half diced (FIG. 1(i)) and background (FIG. 1(j)) to both thin and singulate the packages as described in the '701 patent application. The singulation grooves 156 may be formed by traditional gang sawing, laser ablation or by any other suitable means. As described in the '701 application, an advantage of the half dicing is that it permits the packages to be conveniently separated by the backgrinding operation so long as the depth of the singulation grooves is sufficient to insure that the backgrinding sacrifices all of the carrier 105 below the singulation grooves. It should be appreciated that the top surface 154 of the bumped molded carrier structure 153 would typically be secured to a releasable mount tape during the backgrinding operation.

It is noted that in the illustrated embodiment, much (but not all) of the carrier 105 is sacrificed during the backgrinding. This results in a multiplicity of fully encapsulated dice that are well protected from light interference. Of course, in alternative embodiments, more or all of the carrier structure 105 may be sacrificed to expose the back surface of the dice and when desired, the back grinding can also thin the dice 121 and surrounding encapsulant layer 132 to further thin the resulting packages.

It should be appreciated that the described process can be accomplished using low cost production equipment and/or equipment that tends to be on-hand at many packaging facility. This facilitates the creation of µSMD packages that fully encapsulate the dice and redistribute the die I/O pads at a much lower cost than currently possible. By way of example, it is estimated that at moderate production levels, the use of transfer molding to form epoxy carriers 105, wire bonding to form the stud bumps interconnects 123, screen printing as the encapsulation techniques, and a low cost redistribution layer formation technique, can substantially reduce the total amortized per wafer (carrier) costs of packaging.

It should also be appreciated that the described approach does not require the creation of specialized molds or the use of processing steps that are likely to have long lead times to implement, so prototyping and production can be accomplished very quickly as well.

Figure 2:
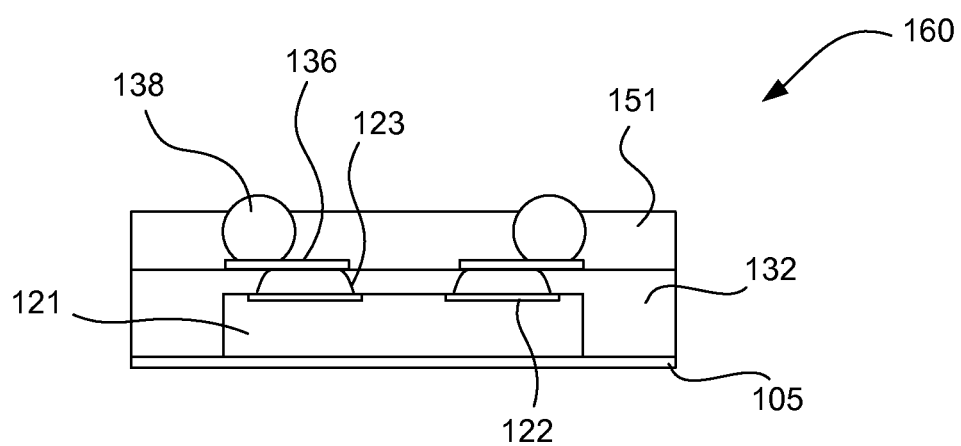
FIG. 2 illustrates a singulated integrated circuit formed in accordance with the process illustrated in FIG. 1.
Figure 3A:
FIGS. 3(a)-3(e) illustrate steps in a process for packaging integrated circuits in accordance with a second embodiment.
Figure 3B:
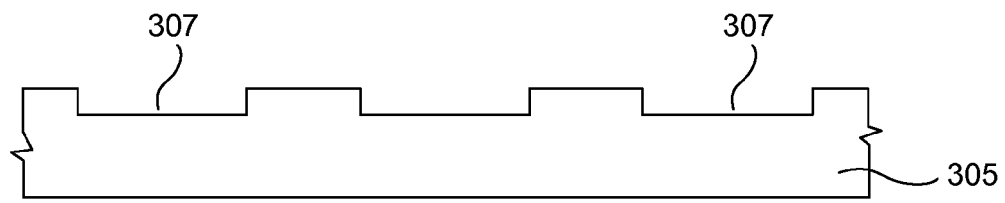
Figure 3C:
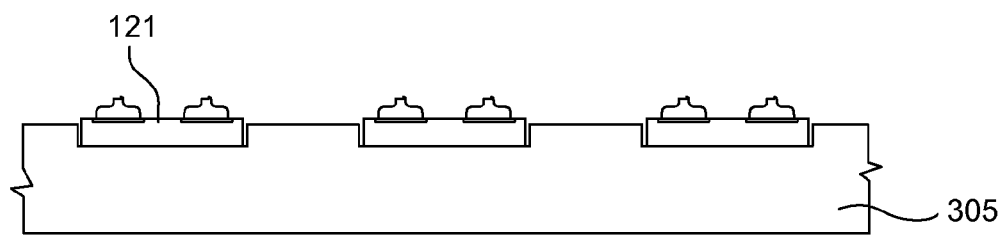
Figure 3D:
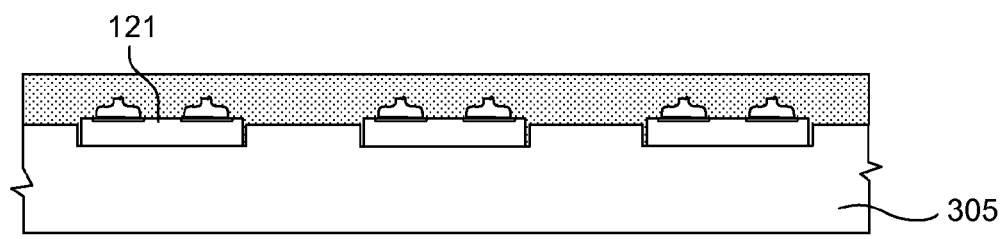
Figure 3E:
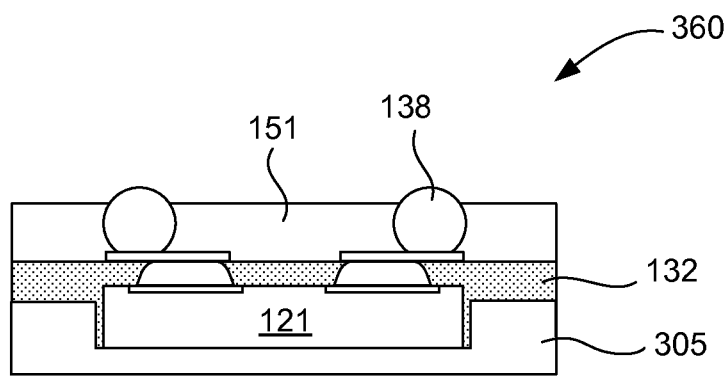
Figure 4A:
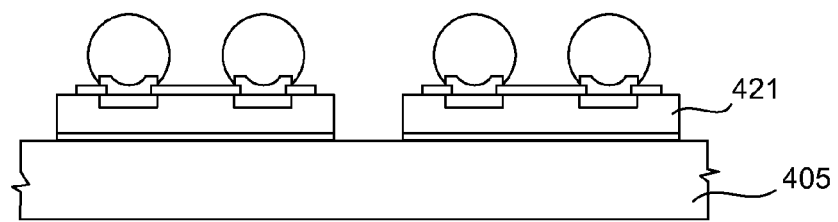
FIGS. 4(a)-4(d) illustrate steps in a process for packaging integrated circuits in accordance with a third embodiment.
Figure 4B:
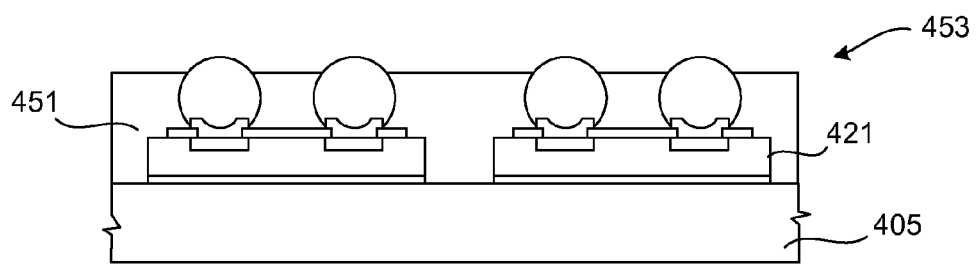
Figure 4C:
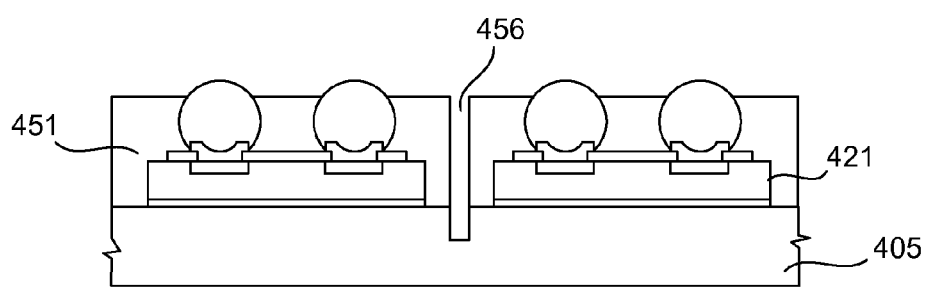
Figure 4D:
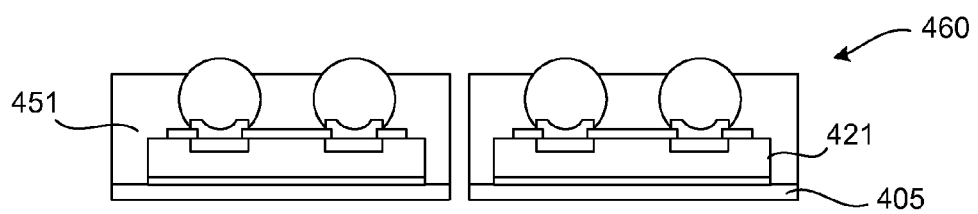
Figure 5A:
FIGS. 5(a)-5(e) illustrate steps in a process for packaging integrated circuits in accordance with a fourth embodiment.
Figure 5B:
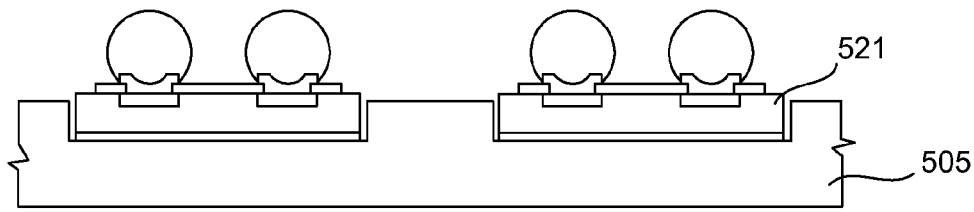
Figure 5C:
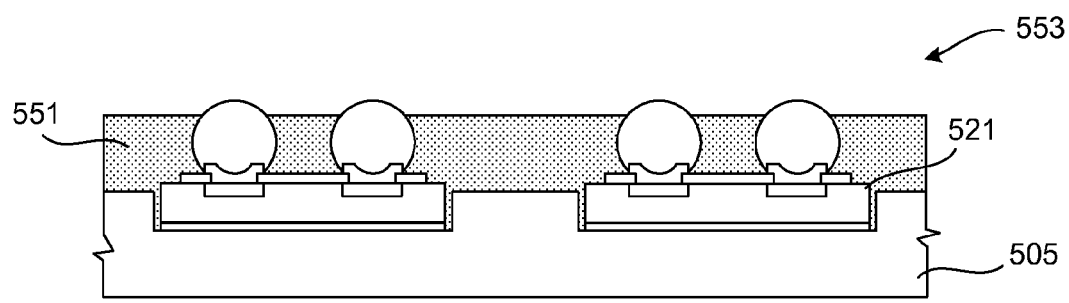
Figure 5D:
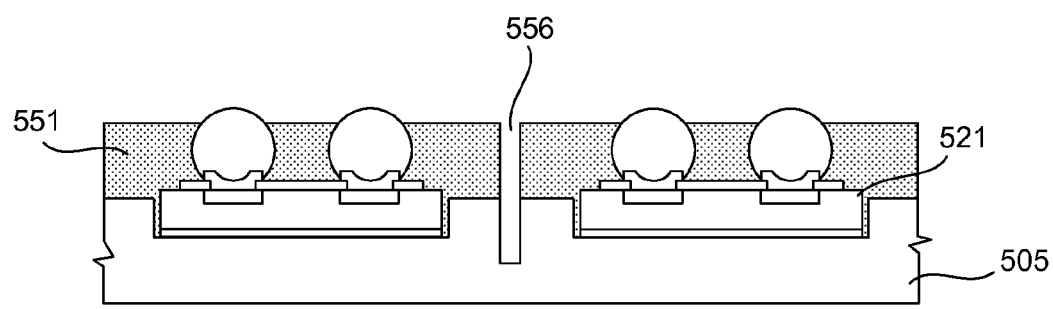
Figure 5E:
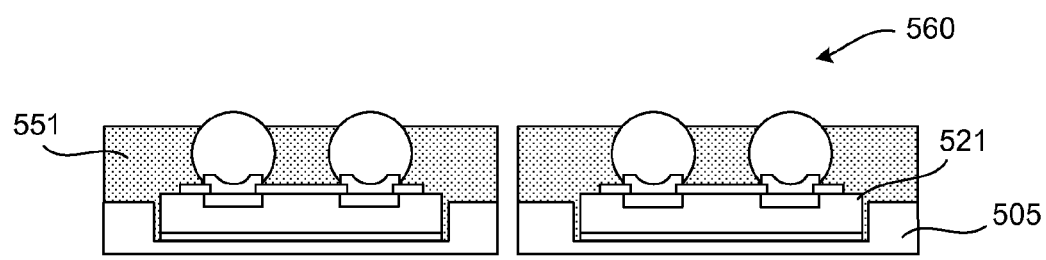

In the embodiment of FIG. 2, the resulting packages 160 include a die mounted on the plastic base 105, the die 121 having a multiplicity of bond pads 122 thereon. Wire bonded stud bumps 123 are attached to associated bond pads 122. A plastic encapsulant material 132 covers the die 121 and cooperates with the plastic base 105 to encase the die such that no portion of the die 121 is exposed to ambient light. The top surfaces of the stud bumps 123 are smooth and substantially parallel with a top surface of the plastic encapsulant material 132. A conductive redistribution layer 136 is formed over the plastic encapsulant material 132. The redistribution layer 136 includes a plurality of traces and of solder pads. The traces electrically connect an associated stud bump 123 to an associated solder pad and at least some of the solder pads are laterally offset relative to their associated stud bump. Solder bumps 138 are attached to associated solder pads in the redistribution layer. A contact encapsulant layer 151 covers the conductive redistribution layer and at least partially embeds the solder bumps 138 to provide additional mechanical support for the resulting packages. The thickness of the base 105 may be widely varied, but in some µSMD package applications, the thickness of the base may be less than the thickness of the die 121 and less than the thickness of the contact encapsulation layer 151.

Referring next to FIG. 3, a second embodiment will be described. This embodiment utilizes a packaging process very similar to the process described above with respect to FIG. 1, except that a number of die recesses 307 are formed in the carrier 305 as seen in FIG. 3(b). The die recesses 307 are arranged to receive the dice 121 as illustrated in FIG. 3(c). In this embodiment, the dice 121 are not affirmatively attached to the carrier using conventional die attach techniques when they are placed into the recesses. Rather, the dice may be inserted into the recesses 307 using pick and place equipment without being affirmatively attached to the carrier. The recesses hold the dice in place and serve to adequately fix the position the dice relative to the carrier for the subsequent dice encapsulation illustrated in FIG. 3(d). When the dice are encapsulated over the carrier, some of the encapsulant material 132 fills any voids in the recesses 307 around (i.e., to the sides of) the dice 121 to thereby lock the dice into place.

As with the first described embodiment, the carrier 305 is preferably formed from a low cost plastic. The recesses can be formed in any suitable manner. However, in a preferred approach, the recesses are formed by laser ablation. Some of the advantages of laser ablation are that (1) plastic is very easily ablated so that the recesses can be formed relatively easily; (2) laser ablation equipment is relatively low cost capital equipment; (3) no specialized molds are required, as they would be if the recesses were formed as part of an injection molding process; (4) no specialized etching equipment or chemicals are necessary as they would be if the recesses were formed by conventional etching techniques; and (5) when desired, other marks or features (e.g., fiducials, etc.) can readily be made on the carrier in parallel with the recesses.

The actual size of the recesses 307 relative to the dice that they receive can also vary. In some implementations, the recesses have a footprint that is just slightly larger than the footprint of the dice that they receive. Even with relatively minimal tolerances, conventional pick-and-place equipment can readily place the dice in their affiliated recesses, and the recesses constrain movement of the dice adequately during handling and encapsulation to fix the position of the dice for subsequent processing. In other embodiments, the recesses may be significantly larger than the dice and the dice may be properly positioned in their respective recesses by simply tilting and vibrating or shaking the carrier such the dice fall naturally to a reference corner of their associated recesses. Once positioned and encapsulated, the encapsulant layer 132 holds the dice in place. A potential advantage of this approach is that it allows the use of even less precise pick and place equipment. In still other embodiments, when a relatively compliant material is used for the carrier 305, the dice may be slightly larger than the recesses 307 so that the dice must be affirmatively pushed into place. With this approach, the dice are more firmly held in place by the carrier itself.

After the dice 121 have been placed in the recesses 307, the dice may be encapsulated with a plastic encapsulant material 132 as described above with respect to the first embodiment and as illustrated in FIG. 3(*d*). As mentioned previously, when gaps are present between the dice and their associated recesses, some of the encapsulant material 132 fills any voids in the recesses 307 around (i.e., to the sides of) the dice 121. When cured or hardened, the encapsulant material (which may for example be an epoxy type material) locks the dice into place. As will be appreciated by those familiar with encapsulant materials used in semiconductor packaging, many encapsulants incorporate filler materials. Since it the gaps and voids in recesses 307 may be quite narrow and it is typically desirable to fill the voids with the encapsulant, it may be desirable to utilize encapsulants with smaller diameter filler or no filler at all.

After the encapsulant layer 132 has been deposited, the encapsulated carrier structure 330 may be processed in a manner similar to the previously described embodiments resulting in singulated, integrated circuit packages 360 as illustrated in FIG. 3(*e*).

In the embodiments illustrated in FIGS. 1-3, the dice are fully encapsulated and at least some of the contacts on the dice are redistributed via a redistribution layer 136. However, in some embodiments, there is no need to provide redistribution of the contacts. In such embodiments, the packaging process can be even further simplified. By way of example, in some embodiments solder bumps may be formed directly on either the bond pads or the exposed stud bumps. One such process for forming fully encapsulated micro surface mount devices will be described next with reference to FIGS. 4(*a*)-4(*d*). The packages formed in this embodiment include solder bumps 438 that are not redistributed relative to their underlying dice.

Initially, a multiplicity of solder bumped dice 421 are mounted on a plastic carrier 405 as illustrated in FIG. 4(*a*) using any suitable die attach technique. A contact encapsulation layer 451 is applied over the dice 421 as illustrated in FIG. 4(*b*). As in the previous described embodiments, the contact encapsulated layer 451 may be applied using any suitable technique including screen printing, spin on coating, molding, etc. The solder bumps 438 on the contact encapsulated carrier structure 453 may then be deflashed as appropriate using a laser or by any other suitable technique.

After the contact encapsulant 451 has been applied, the carrier structure maybe half diced as shown in FIG. 4(*c*). Once again, the singulation grooves 456 are preferably cut to extend below the dice 421 such that they extend into the carrier 405. After grooves 456 have been cut, the back surface of carrier 405 may be thinned by backgrinding or other suitable techniques to both thin and singulate the resulting packages as illustrated in FIG. 4(*d*). In the illustrated environment the back grinding of the carrier 405 substantially thins, but does not eliminate the carrier 405. Accordingly, the dice 421 in the resulting packages 460 are fully encapsulated. That is, they are fully surrounded by the combination of the remaining portion of carrier 405 and the contact encapsulant material 451.

In the embodiment illustrated in FIG. 4(*a*)-4(*d*), the dice 421 are mounted on a flat surface of carrier 405. However in alternative embodiments, the carrier may include die cavities as shown in FIG. 5(*a*), which is similar to the carrier used in FIG. 3. In this embodiment, dice 521 are placed in die cavities 506 formed in carrier 505 as shown in FIG. 5(*b*). Again, the die cavities 506 may be formed using any suitable mechanism, as for example, laser ablation. A contact encapsulation layer 551 is applied over the dice 521 as illustrated in FIG. 5(*c*). As in the previous described embodiments, the contact encapsulated layer 551 may be applied using any suitable technique including screen printing, spin on coating, molding, etc. The solder bumps 538 on the contact encapsulated carrier structure 553 may then be deflashed as appropriate using a laser or by any other suitable technique. Thereafter, the carrier structure maybe half diced as shown in FIG. 5(*d*) and the back surface of carrier 505 may be thinned by backgrinding or other suitable techniques to both thin and singulate the resulting packages as illustrated in FIG. 5(*e*).

Although only a few embodiments of the invention have been described in detail, it should be appreciated that the invention may be implemented in many other forms without departing from the spirit or scope of the invention. Several very low cost components and steps (e.g. the use of plastic carriers, screen printing, bonding wire interconnects, grinding, laser ablation, etc.) that cooperate to provide a very low cost approach to forming μSMD packages. Although the described combinations work very well, it should be appreciated that in some cases a facility may have particular equipment on hand that makes it more appropriate and/or cost effective to substitute other known processes for one or more of the described steps. Thus, it is contemplated that the described processes may be modified to utilize such available resources. Therefore, the present embodiments should be considered illustrative and not restrictive and the invention is not to be limited to the details given herein, but may be modified within the scope and equivalents of the appended claims.

What is claimed is:

1. A method of packaging integrated circuits:
   mounting a multiplicity of dice on a plastic carrier, wherein each of the dice includes a plurality of I/O pads having wire bonded contact studs secured thereto;
   covering the dice with an encapsulant material to form an encapsulant carrier structure wherein the encapsulant material is applied by one of screen printing and stencil printing;
   grinding a first surface of the encapsulant and the contact studs such that exposed portions of the contact studs are smooth and substantially co-planar with the first surface of the encapsulant;
   forming a conductive redistribution structure over the encapsulant carrier structure, wherein at least some of the contact studs are in electrical communication with the conductive redistribution structure, the conductive redistribution structure including a plurality of solder pads, each of the solder pads being electrically connected to an associated contact stud, wherein at least some of the solder pads have centers that are offset relative to the centers of their associated contact studs;
   creating solder bumps on the solder pads; and applying a second encapsulant layer over the encapsulant carrier structure that embeds at least portions of the contact bumps and covers the redistribution structure.

2. A method as recited in claim 1 further comprising:

cutting singulation grooves that extend from an exposed top surface of the second encapsulant layer into the carrier prior to the grinding of the back surface of the carrier; and after formation of the singulation grooves, grinding a back surface of the carrier to thin, but not completely sacrifice the carrier such that after the back grinding, each die is surrounded by associated portions of the carrier and the encapsulant material such that no portion of the dice are exposed to ambient light and wherein the grinding of the back surface of the carrier sacrifices enough of the carrier to expose the singulation grooves thereby accomplishing singulation of the encapsulant carrier structure to form a multiplicity of individual packages.

3. A method as recited in claim 1 further comprising laser deflashing portions of the solder bumps after the second encapsulant is applied.

4. A method as recited in claim 1 wherein the carrier is formed by transfer molding.

5. A method as recited in claim 1 wherein the second encapsulant layer is applied by screen printing.

6. A method of packaging integrated circuits comprising:

mounting a multiplicity of dice on a carrier, wherein each of the dice includes a plurality of I/O pads having wire bonded contact studs secured thereto;

covering the dice and at least portions of the contact studs with an encapsulant material to form an encapsulant carrier structure; and grinding a first surface of the encapsulant and the contact studs such that exposed portions of the contact studs are smooth and substantially co-planar with the encapsulant;

wherein the encapsulant material is applied by one of screen printing and stencil printing;

forming a conductive redistribution structure over the encapsulant carrier structure, wherein at least some of the contact studs are in electrical communication with the conductive redistribution structure, the conductive redistribution structure including a plurality of solder pads, each of the solder pads being electrically connected to an associated contact stud, wherein at least some of the solder pads have centers that are offset relative to the centers of their associated contact studs; and creating solder bumps on the solder pads.

7. A method as recited in claim 6 further comprising applying a second encapsulant over the encapsulant carrier structure that embeds at least portions of the solder bumps and covers the redistribution structure.

8. A method as recited in claim 7 further comprising grinding a back surface of the carrier after the application of the second encapsulant, to thin, but not completely sacrifice the carrier such that after the back grinding, each die is surrounded by associated portions of the carrier and the encapsulant material such that no portion of the dice are exposed to ambient light.

9. A method as recited in claim 8 further comprising cutting singulation grooves that extend from a top surface of the encapsulant carrier structure into the carrier, wherein the singulation grooves are cut after the application of the second encapsulant and prior to the grinding of the back surface of the carrier, and wherein the grinding of the back surface of the carrier sacrifices enough of the carrier to expose the singulation grooves thereby accomplishing singulation of the encapsulant carrier structure to form a multiplicity of individual packages.

10. A method as recited in claim 6 further comprising grinding a back surface of the carrier to thin, but not completely sacrifice the carrier such that after the back grinding, each die is surrounded by associated portions of the carrier and the encapsulant material such that no portion of the dice are exposed to ambient light.

11. A method as recited in claim 10 further comprising cutting singulation grooves that extend from a top surface of the encapsulant carrier structure into the carrier prior to the grinding of the back surface of the carrier, and wherein the grinding of the back surface of the carrier sacrifices enough of the carrier to expose the singulation grooves thereby accomplishing singulation of the encapsulant carrier structure to form a multiplicity of individual packages.

12. A method as recited in claim 6 wherein the carrier is formed from plastic.

* * * * *